March 12, 1963 S. L. MILLER 3,081,370
SOLAR CELLS
Filed July 17, 1961
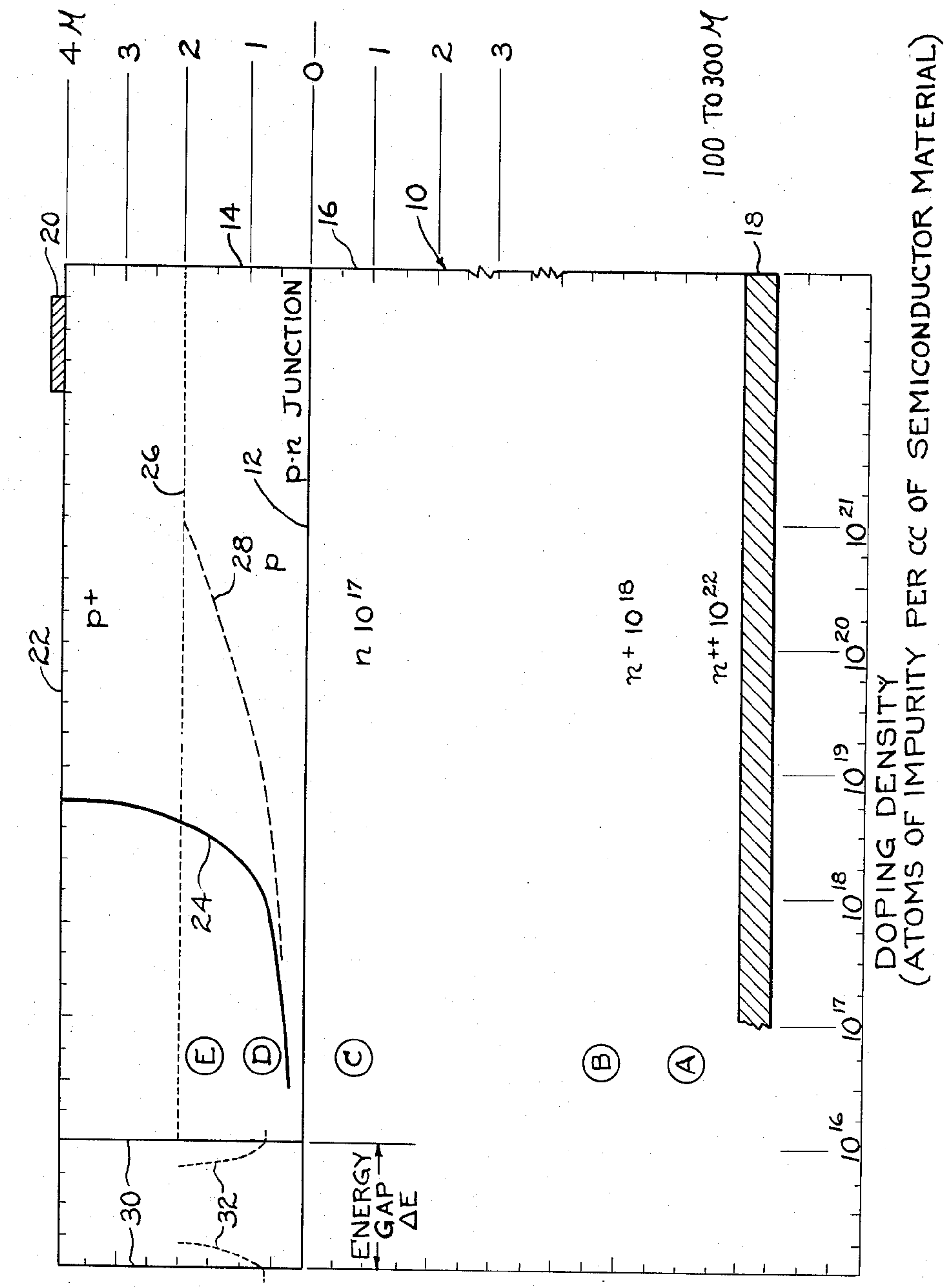
INVENTOR.
SOLOMON L. MILLER
BY
CHRISTIE, PARKER & HALE
ATTORNEYS United States Patent Office 3,081,370
Patented Mar. 12, 1963

3,081,370
SOLAR CELLS

Solomon L. Miller, Sunnyvale, Calif., assignor, by mesne assignments, to Raytheon Company, Lexington, Mass., a corporation of Delaware Filed July 17, 1961, Ser. No. 124,460
7 Claims. (Cl. 136—89)

This invention relates to improvements to photovoltaic cells for converting sunlight into electrical energy.

Solar cells or batteries are made from semiconductor bodies with p-n junctions located relatively close to one surface which is irradiated with energy, such as sunlight. The radiant energy produces electron-hole pairs, which are separated by the junction field at the junction to serve as an electrical power source.

For maximum efficiency, all other factors being equal, the external resistance of the battery should be as low as possible. To provide low external resistance, the surface of a conventional solar cell is heavily doped with suitable impurity to provide a low "sheet" or lateral resistance and reduce power loss in the battery.

Unfortunately, the heavy doping of the surface produces a "degenerate" layer, i.e., a layer which is highly conductive, but which also has a reduced energy gap so that much of the radiation is absorbed and wasted in the degenerate layer.

For the purpose of explaining this invention, the term "degenerate semiconductor material" means a semiconductor material with a sufficiently high concentration of impurity that the number of carriers in the material is no longer temperature dependent.

The energy gap of a semiconductor material is defined as the energy difference in volts required to move an electron from a filled to an unfilled band and make the material conductive. Ordinarily, impurities can be added in relatively large concentrations without affecting the energy gap of semiconductor materials, but once a critical concentration is reached, the energy gap decreases relatively rapidly.

The absorption of radiant energy in the surface layer is more pronounced as the wave length of the radiation decreases. Therefore, with solar cells such as are used in satellites, i.e., outside the earth's atmosphere, the proportion of shorter wave length reaching the solar cell is higher, and the efficiency of the solar cells with degenerate surface layers is relatively lower. Furthermore, the carriers generated in the degenerate layer must surmount a potential energy barrier approximately equal to the reduction in energy gap to be collected by the junction. This degenerate portion is also a region of low life time for the carriers, which further reduces the efficiency of the separation of the carriers by the junction.

This invention overcomes the disadvantage of previous solar batteries by providing a solar cell which avoids a degenerate layer on the irradiated surface. Instead, the layer of the semiconductor material from near the junction to the surface is relatively heavily doped with impurities, but just below the point of reducing the energy gap of the material. Preferably, the heavily doped layer is made substantially thicker than the previous layers to provide reduced resistance to the collection of carriers by the surface electrode. Thus, with the solar battery of this invention the degenerate surface layer is avoided, resulting in greater utilization of the radiant energy irradiating the surface of the cell. Moreover, the advantage of the cell is even more pronounced when the source of radiant energy is relatively high in short wave length radiation, such as the sun's radiation above the earth's atmosphere.

In brief, the solar cell of this invention is made with a heavily doped (but short of reducing the energy gap) and relatively thick surface layer. Such a cell does not suffer from the deleterious effects of a degenerate layer, has a surface layer sheet resistance comparable to that obtained in the present cells using degenerate materials, and has the additional advantage of improving the collection efficiency of carriers generated deep within the battery by the longer wave length proportions of the specrum. This last advantage is obtained because the junction is deeper in the cell.

In the presently preferred form of the invention, the layer of semiconductor material which extends from the surface of the solar battery toward the junction has a semiconductor impurity concentration from about .01 to about .90 of that required to cause a reduction in energy gap of the material. The thickness of the layer between the junction and the surface of the battery is between about 2 and about 6 microns. Preferably, the impurity concentration of the solar battery decreases from the surface toward the junction, and then increases from the junction in the direction away from the surface. This provides a drift field in the semiconductor on both sides of the junction to facilitate the collection of carriers.

These and other aspects of the invention will be more fully understood from the following detailed description and the accompanying schematic drawing of the presently preferred embodiment of the invention.

Referring to the drawing, a flat body 10 of semiconductor material includes a p-n junction 12 between a surface layer 14 of p-type semiconductor material, and a bottom layer 16 of n-type semiconductor material. A bottom electrode contact 18 is connected across the bottom of the semiconductor body, and a surface electrode contact 20 is attached to a relatively small portion of the top surface 22 of the semiconductor body. The top surface 22 is adapted to receive electromagnetic radiation from any suitable source, say the sun.

For the purpose of explaining the invention, it is assumed that the semiconductor material is silicon, although other materials such as germanium or gallium arsenide may be used.

Although not entirely critical, the thickness of the layer above the p-n junction is between about two and about six microns. For purpose of illustration the layer is shown four microns thick (see the scale on the right side of the drawing). The thickness of the layer underneath the junction is preferably between about 100–300 microns.

The impurity concentration of the irradiated surface layer is shown by a solid curve 24, which represents a plot of doping density (see the scale at the bottom of the drawing) versus depth in the surface layer. The impurity concentration at the top of the irradiated surface is about $5 \times 10^{18}$ atoms of impurity per cc. of semiconductor material, and decreases relatively slowly to about $10^{18}$ atoms of impurity per cc. for a substantial distance toward the junction. Near the p-n junction the impurity concentration decreases rapidly to about $10^{16}$ atoms/cc. Of course, the net impurity concentration at the junction drops to zero. The impurity may be any of the suitable p-type materials, such as boron, gallium, indium, or aluminum.

The layer below the p-n junction includes an n-type impurity material such as phosphorus, antimony, or arsenic. The concentration of the n-type impurity increases from about $10^{17}$ atoms cc. to about $10^{22}$ atoms/cc. as indicated on the drawing.

A horizontal dotted line 26 near the top of the drawing indicates the usual position of the top of the surface layer of a conventional solar cell which has a degenerate portion at the top surface of the cell. A dotted curve 28 shows for the conventional cell a typical distribution of impurity atoms per cc. of semiconductor material versus distance from the junction, using the doping density scale at the bottom of the drawing. As curve 28 shows, the conventional solar battery has an impurity concentration of around $10^{16}$ impurity atoms/cc. near the p-n junction, and the concentration of impurities increases relatively fast to about $10^{21}$ impurity atoms/cc. at the surface. A material such as silicon becomes degenerate, i.e., the energy gap begins to reduce substantially, at around $5 \times 10^{18}$ impurity atoms/cc. of semiconductor material. This means that for the example shown in the drawing the top 1.3 microns of a conventional type of solar battery is degenerate, i.e., has a reduced energy gap, and therefore has relatively high absorption for all portions of the spectrum. The cell of this invention avoids the degeneracy of the semiconductor material because the impurity concentration is constrained to be near but below $5 \times 10^{18}$ atoms/cc.

Of course, the upper limit of impurity concentration which should be used in accordance with this invention will vary because the reduction of energy gap begins at different values in the various semiconductor materials. For example, in germanium the energy gap begins to decrease when the impurity concentration reaches about $10^{19}$ atoms/cc. Accordingly, a solar cell made of germanium in accordance with this invention has an impurity concentration near but below this value at the top of the surface layer. The concentration can, of course, be substantially less than that required to reduce the energy gap, but it is preferred to have the concentration as high as possible within the above indicated limits to reduce resistivity. Preferably, the impurity concentration from the top of the surface layer for a substantial distance, say 1–5 microns, toward the junction is within about a factor of 10 of that concentration at which the energy gap begins to decrease. For example, if the energy gap begins to decrease at an impurity concentration of about $10^{19}$ atoms/cc., the impurity concentration of the top portion of the surface layer is between $10^{18}$ and $10^{19}$ atoms/cc. Moreover, the surface layer is made relatively thick, say 2–6 microns to decrease resistance to the flow of carriers to the surface electrode.

The function of energy gap versus distance from the surface is shown by the diagram on the left side of the drawing. The pair of vertical solid lines 30 represent the energy gap for the surface layer made in accordance with this invention and show that the energy gap is constant from the top of the surface layer to the p-n junction. On the other hand, the dotted curved lines 32 represent the energy gap of the surface layer of the conventional solar batteries in which the top portion of the surface layer is degenerate. As is seen from curves 32 there is a significant reduction in energy gap from the top of the surface layer for a substantial distance toward the junction. It is this reduction in energy gap which causes the top portion of the surface layer of the conventional solar batteries to decrease the efficiency of the battery by absorbing excessive amounts of radiation, and providing a zone of low lifetime for the carriers. Even more important, the reduction in energy gap imposes a potential energy barrier which impedes the diffusion of carriers to the junction.

On the other hand, the battery made in accordance with this invention has a relatively thick layer of material with a constant energy gap. Yet, the surface layer is sufficiently heavily doped so that its resistance is comparable to that provided by the degenerate layer in the prior art solar batteries. Moreover, the material of constant energy gap has the following advantages:

(1) Provides a zone of longer lifetime for the carriers;

(2) Minimizes top surface absorption of the radiation in a region where it is least likely to be effective in producing electron-holes which are separated by the p-n junction;

(3) Is free of the potential energy barrier to the diffusion to and subsequent collection by the junction of the carriers; and (4) Increases the collection efficiency of the carrier pairs generated relatively deep within the battery by the long wave length portion of the spectrum because the junction is deeper below the top of the surface layer.

Moreover, the gradients of resistivity on both sides of the junction create drift fields to improve the collection of carriers.

In the operation of the device shown in the drawing, impinging radiation absorbed in the surface layer produces pairs of electrons and holes. The built in drift field, which results from the impurity gradient in the surface layer urges the electrons to diffuse toward the p-n junction and facilitates their collection. Radiation passing through the junction and absorbed in the bottom layer also creates carrier pairs. The holes are urged to move toward the p-n junction by the drift field resulting from the impurity gradient in the bottom layer.

Although the foregoing example discusses the specific embodiment in which the surface layer is a p-type material, it is obvious that the surface layer can be n-type material and the bottom layer p-type material.

The substantially constant high impurity concentration for a considerable depth in the surface layer is most easily obtained by the controlled epitaxial growth of the semiconductor body. The starting material is a piece of semiconductor material, say silicon, heavily doped (say $10^{22}$ atoms/cc.) with n-type material, say phosphorous. This piece is represented by the horizontal zone A in the drawing. A B zone layer is epitaxially deposited on zone A from $SiCl_4$ vapor which includes an n-type impurity (say phosphorous in the form of phosphorous trichloride in sufficient quantity to produce an impurity concentration of about $10^{18}$ atoms/cc. Thereafter zone C is epitaxially deposited on zone B with sufficient n-type impurity to provide a concentration of about $10^{17}$ atoms/cc. A zone D is epitaxially deposited on zone C with sufficient p-type impurity (say boron trichloride) to provide a concentration of about $10^{16}$ atom/cc. and form the p-n junction. Finally, zone E is epitaxially deposited on zone D with sufficient p-type impurity to provide an increasing concentration of impurity in the direction away from the junction to about $5 \times 10^{18}$ atoms/cc. to the top of the surface layer. This concentration is near, but just below, that concentration which produces a reduction in the energy gap of the semiconductor material, and extends a substantial distance from the top of the surface layer toward the junction.

Of course, the various zones need not be deposited with abrupt changes in impurity concentration. Instead, the impurities can be added so there is a concentration gradient throughout the layers on both sides of the junction. In fact, this is preferred to establish the drift fields for substantial distances on opposite sides of the junction.

A solar cell constructed as described above is free of the deleterious effects of a degenerate layer, has a surface layer sheet resistance comparable to those used at present, and has the additional advantage of improving the collection efficiency of carriers generated relatively deep within the cell by the long wave length portion of the spectrum, because this junction is farther from the irradiated surface. The advantage of the freedom from the degenerate layer is even greater out of the earth's atmosphere where the solar spectrum has greater intensity in the short wave length region.

I claim:

1. A photovoltaic energy converter comprising a first layer of semiconductor material with one type of impurity material, a second layer of semiconductor material with the opposite type of impurity material, the second layer being in contact with the first layer to form a p-n junction, one of the layers having a surface spaced from the junction and disposed to receive radiation which generates carriers in the converter, the said one layer including at the said surface the said impurity at a concentration below that which reduces the energy gap in the said layer and including a zone which extends from the said surface a substantial distance toward the junction with the said impurity at a concentration between about 10% and about 90% of that required to reduce the energy gap in the said layer, and separate electrical contacts in contact with each layer for withdrawing energy from the converter.

2. A photovoltaic energy converter comprising a first layer of semiconductor material with one type of impurity material, a second layer of semiconductor material with the opposite type of impurity material, the second layer being in contact with the first layer to form a p-n junction, one of the layers having a surface spaced from the junction and disposed to receive radiation which generates carriers in the converter, the said one layer including at the said surface the said impurity at a concentration below that which reduces the energy gap in the said layer and including a zone which extends from the said surface between about 2 and about 6 microns toward the junction with the said impurity at a concentration between about 10% and about 90% of that required to reduce the energy gap in the said layer, and separate electrical contacts in contact with each layer for withdrawing energy from the converter.

3. A converter in accordance with claim 2 in which the impurity concentration in the said zone is within a factor of about 10 of that required to reduce the energy gap of the semiconductor material.

4. A converter in accordance with claim 2 in which the said one layer has a thickness between about 2 and about 6 microns, and the other layer has a thickness between about 100 and about 300 microns.

5. A photovoltaic energy converter comprising a first layer of semiconductor material with one type of impurity material, a second layer of semiconductor material with the opposite type of impurity material, the second layer being in contact with the first layer to form a p-n junction, one of the layers having a surface spaced from the junction and disposed to receive radiation which generates carriers in the converter, the said one layer including at the said surface the said impurity at a concentration below that which reduces the energy gap in the said layer and including a zone which extends from the said surface a substantial distance toward the junction with the said impurity at a concentration between about 10% and about 90% of that required to reduce the energy gap in the said layer, the concentration of the impurities in each of the layers increasing with distance from the junction, and separate electrical contacts in contact with each layer for withdrawing energy from the converter.

6. A photovoltaic energy converter comprising a first layer of silicon with one type of impurity material, a second layer of silicon with the opposite type of impurity material, the second layer being in contact with the first layer to form a p-n junction, one of the layers having a surface spaced from the junction and disposed to receive radiation which generates carriers in the converter, the said one layer including at the said surface the said impurity at a concentration between about $10^{17}$ and about $5 \times 10^{18}$ atoms/cc. of silicon and including a zone which extends from the said surface a substantial distance toward the junction with the said impurity at a concentration close to but below that which reduces the energy gap in the said layer, and separate electrical contacts in contact with each layer for withdrawing energy from the converter.

7. A converter according to claim 6 in which the said zone is between about 2 and about 6 microns thick.

References Cited in the file of this patent

UNITED STATES PATENTS

| | | |
|---|---|---|
| 2,537,256 | Brattain | Jan. 9, 1951 |
| 2,780,765 | Chapin et al. | Feb. 5, 1957 |
| 2,794,846 | Fuller | June 4, 1957 |
| 2,873,303 | Rittner | Feb. 10, 1959 |
| 2,929,859 | Loferski | Mar. 22, 1960 |